(12) United States Patent
Steuer et al.

(10) Patent No.: US 10,775,610 B2
(45) Date of Patent: Sep. 15, 2020

(54) MICROMECHANICAL ACTUATOR DEVICE AND METHOD FOR TILTING A MICROMECHANICAL ACTUATOR DEVICE

(71) Applicant: Robert Bosch GmbH, Stuttgart (DE)

(72) Inventors: Benjamin Steuer, Waldenbuch (DE); Frederic Njikam Njimonzie, Reutlingen (DE); Joerg Muchow, Reutlingen (DE); Rainer Straub, Ammerbuch (DE); Stefan Pinter, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 121 days.

(21) Appl. No.: 15/758,671

(22) PCT Filed: Jul. 18, 2016

(86) PCT No.: PCT/EP2016/067018
§ 371 (c)(1),
(2) Date: Mar. 8, 2018

(87) PCT Pub. No.: WO2017/045806
PCT Pub. Date: Mar. 23, 2017

(65) Prior Publication Data
US 2018/0252912 A1    Sep. 6, 2018

(30) Foreign Application Priority Data
Sep. 18, 2015   (DE) .................. 10 2015 217 935

(51) Int. Cl.
*G02B 26/08*       (2006.01)
*G02B 26/10*       (2006.01)
*B81B 3/00*        (2006.01)

(52) U.S. Cl.
CPC ......... *G02B 26/085* (2013.01); *G02B 26/101* (2013.01); *G02B 26/105* (2013.01); *B81B 3/0018* (2013.01)

(58) Field of Classification Search
None
See application file for complete search history.

(56) References Cited

U.S. PATENT DOCUMENTS 5,606,447 A  *  2/1997  Asada ................ G02B 26/0816
                                                    359/199.1
2003/0137711 A1    7/2003  Yagi et al.
(Continued)

FOREIGN PATENT DOCUMENTS

JP    2003255259 A    9/2003
JP    2004110005 A    4/2004
(Continued)

OTHER PUBLICATIONS

International Search Report dated Oct. 19, 2016, of the corresponding International Application PCT/EP2016/067018 filed Jul. 18, 2016.

*Primary Examiner* — Jennifer D. Carruth
(74) *Attorney, Agent, or Firm* — Norton Rose Fulbright US LLP; Gerard Messina

(57) ABSTRACT

An actuator device and a method for tilting an actuator device. The method includes the steps: conducting electrical current through an electrical conduction device, which is guided via a tilting device of the actuator device, within a first magnetic field that is generated by a permanent magnet device of the actuator device, so that an actuator element of the tilting device is tilted along a first tilting axis as the result of a Lorentz force; and generating a second magnetic field by an electromagnet device of the actuator device in the area of the permanent magnet device, so that the tilting device is (Continued)

tilted along a second tilting axis as the result of magnetic attraction and repulsion.

10 Claims, 11 Drawing Sheets

(56) References Cited

U.S. PATENT DOCUMENTS

| | | |
|---|---|---|
| 2004/0105139 A1 | 6/2004 | Hirose et al. |
| 2006/0152106 A1 | 7/2006 | Yan et al. |
| 2008/0054732 A1* | 3/2008 | Ko ................... G02B 26/085 |
| | | 310/36 |
| 2011/0228367 A1 | 9/2011 | Lubianiker et al. |
| 2014/0071510 A1* | 3/2014 | Mizuno ............. G02B 26/101 |
| | | 359/212.1 |
| 2016/0033761 A1* | 2/2016 | Murayama ......... G02B 26/085 |
| | | 359/199.3 |
| 2016/0105090 A1* | 4/2016 | Sadaharu ............ H02K 33/18 |
| | | 310/38 |
| 2016/0116732 A1* | 4/2016 | Yasuda ............... G02B 26/085 |
| | | 359/200.7 |

FOREIGN PATENT DOCUMENTS

| | | |
|---|---|---|
| JP | 2004334966 A | 11/2004 |
| JP | 2005250076 A | 9/2005 |
| JP | 2011203764 A | 10/2011 |
| JP | 2014048327 A | 3/2014 |
| WO | 2012070610 A1 | 5/2012 |
| WO | 2012089387 A1 | 7/2012 |

* cited by examiner

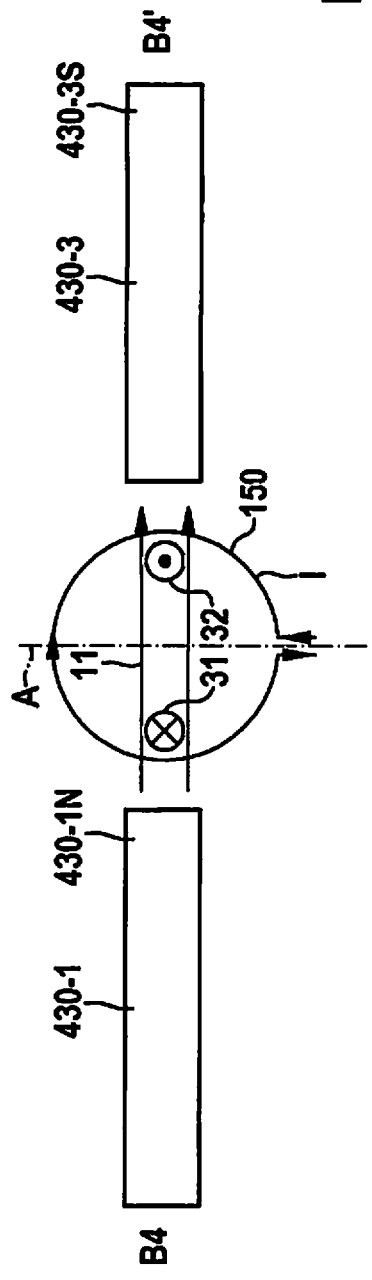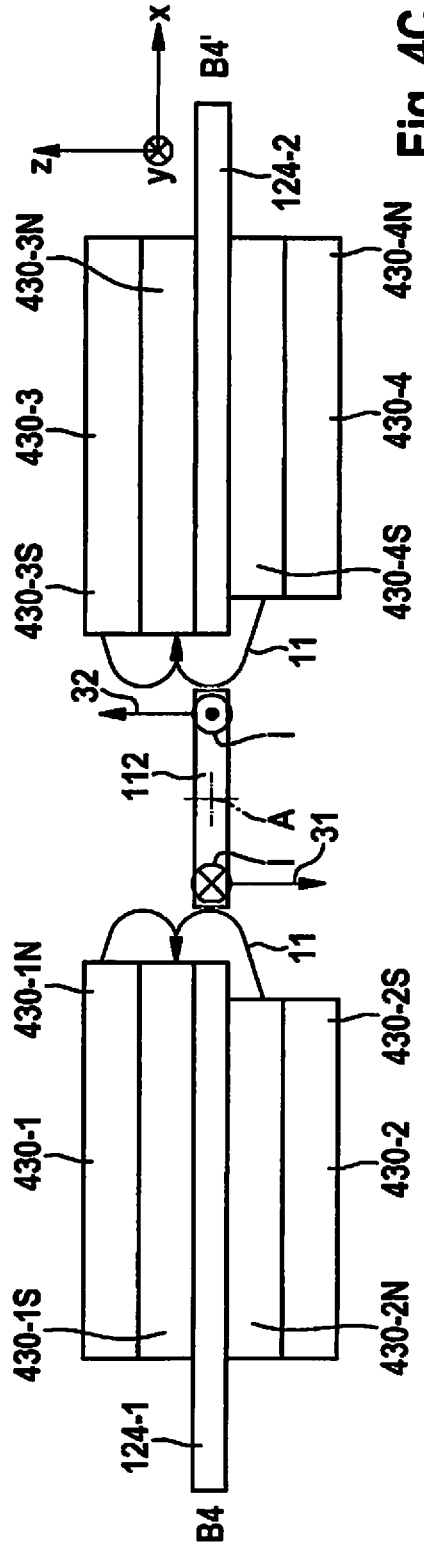

MICROMECHANICAL ACTUATOR DEVICE AND METHOD FOR TILTING A MICROMECHANICAL ACTUATOR DEVICE

FIELD

The present invention relates to a micromechanical actuator device, in particular a micromirror, and a method for tilting a micromechanical actuator device, in particular a micromirror. In particular, the present invention relates to a micromirror that is usable in a laser scanner, and operation of a micromirror as part of a laser scanner.

BACKGROUND INFORMATION

For numerous applications, micromirrors are required that are capable of deflecting a laser beam in two mutually perpendicular directions. For example, such micromirrors are used in laser scanners. Laser scanners are devices that, by sequential scanning of pixels by a horizontally and vertically pivotable laser beam, project an image to be projected. Pivoting of the laser beam generally takes place more slowly in the horizontal direction than in the vertical direction, or vice versa. One line of the image to be projected is generally scanned by pivoting the laser beam according to the faster movement, while various lines of the image to be projected are scanned by pivoting the laser beam according to the slower movement. In laser scanners, two micromirrors connected in succession are frequently used, each being tiltable only about a single axis, so that a laser beam that strikes the micromirror is pivotable in only one dimension.

A micromirror and a system of two micromirrors connected in succession to form a laser scanner are described in PCT There is a need for an efficient, space-saving actuator device, tiltable about two different tilting axes, that is manufacturable with little technical complexity.

SUMMARY

In accordance with example embodiments of the present invention, an actuator device is provided, in particular a micromirror, that includes: a tilting device that includes an actuator element; a first spring device; a retaining device; the tilting device being connected to the retaining device via the first spring device so as to be tiltable about a first tilting axis; at least one electrical conduction device that is guided via the tilting device; a permanent magnet device that is situated on the retaining device; the permanent magnet device being designed for generating a first magnetic field in such a way that when an electrical current is conducted through the electrical conduction device, a Lorentz force is generatable within the first magnetic field, via which the tilting device, in particular the actuator element, is tiltable about the first tilting axis with respect to the retaining device; a frame device; a second spring device via which the retaining device is connected to the frame device so as to be tiltable about a second tilting axis; an electromagnet device that is designed for generating a second magnetic field which acts on the permanent magnet device in such a way that the retaining device is tiltable about the second tilting axis with respect to the frame device. In particular, the actuator element is tiltable about the second tilting axis as the result of tilting the retaining device with respect to the frame device.

An actuator element is understood in particular to mean an element that is capable of reflecting a desired radiation, in particular laser light, at least partially, in particular predominantly. Such an actuator element may also be referred to as a "mirror element." For example, the mirror element may be designed as multiple dielectric layers, as a metallic layer, as a polished layer, etc. Any other arbitrary component to be actuated may also be provided as the actuator element.

Moreover, the present invention provides a method for tilting a micromechanical actuator device, in particular a micromirror, including the steps: conducting electrical current through an electrical conduction device, which via a tilting device of the actuator device is guided within a first magnetic field that is generated by a permanent magnet device of the actuator device, so that the tilting device and/or an actuator element of the tilting device are/is tilted along a first tilting axis as the result of a Lorentz force; and generating a second magnetic field by an electromagnet device of the actuator device in the area of the permanent magnet device, so that the tilting device and/or the actuator element are/is tilted along a second tilting axis as the result of magnetic attraction and repulsion.

In accordance with the present invention, a permanent magnet device of a micromechanical actuator device may be used for generating a Lorentz force that results in tilting of the actuator element about a first tilting axis, and may also be situated in a controllably generatable magnetic field of an electromagnet device in order to achieve tilting of the same actuator element about a second tilting axis.

According to the present invention, high torques are generatable on the actuator element, thus allowing the space requirements for generating the required torques to be reduced. Miniaturization of the MEMS chip surface area, and thus an increased number of actuator devices according to the present invention per wafer, are advantageously achievable. Miniaturization of the chip surface area of the actuator device is effective in particular perpendicular to the second tilting axis, i.e., perpendicular to the axis of the slow tilting movement, which may also be referred to as the "slow axis." This dimension is a critical overall size in applications such as miniaturized projectors in mobile telephones, since a particularly small thickness of the mobile telephone is desired. The present invention thus allows the use and installation of laser scanners as projectors, with preferably consistently thin housing dimensions of mobile telephones and other mobile terminals such as tablets, etc.

The actuator device according to the present invention has a particularly high drive efficiency, as the result of which power consumption for tilting the actuator device is low.

For the drive of the tilting axis of the fast movement, which may also be referred to as the "fast axis," according to the present invention only coils and/or a particular current conduction of the electrical conduction device are/is to be implemented on the tilting device and/or the retaining device. This requires in particular few process steps compared to other implementation options. In particular, highly electrically conductive levels for the electrical conduction device may be used for electrical connections or for position detection which are required anyway. This results in little or no additional technical complexity or additional process steps.

In addition, no large-volume permanent magnets, to be externally fastened to the actuator device, are necessary according to the present invention. This results in a particularly small installation volume, and additional structuring and connection processes are dispensed with. In addition, the resistance of the actuator device to being dropped is increased.

The high available torques of the actuator device allow the use of relatively rigid torsion springs, which may be implemented by webs. This results in a high mechanical overload resistance and drop resistance as well as good controllability and robustness.

Advantageous specific embodiments and refinements are described herein with reference to the figures.

According to a first preferred refinement of the present invention, the first spring device includes a first torsion spring. A first strip conductor for connecting the electrical conduction device to a first electrical pole may be guided via the first torsion spring. The first spring device may also include a second torsion spring, a second strip conductor for connecting the electrical conduction device to a second electrical pole being guided via the first torsion spring and/or via the second torsion spring. Particularly efficient contacting of the electrical conduction device on the tilting device is achievable in this way.

According to another preferred refinement of the present invention, the second spring device includes at least one third torsion spring via which at least one strip conductor, for example the first or second strip conductor described above, is guided for connecting the electrical conduction device to at least one electrical pole, in particular the first or the second electrical pole.

According to another preferred refinement of the present invention, the permanent magnet device includes at least one first permanent magnet and/or at least one second permanent magnet. A magnetic north-south orientation of the first permanent magnet and/or a magnetic north-south orientation of the second permanent magnet is preferably in parallel or antiparallel to the second tilting axis and/or perpendicular with respect to the first tilting axis. A particularly favorable orientation of the magnetic flux lines in the area of the electrical conduction device may thus be achieved. The permanent magnet device also preferably includes a third and/or a fourth permanent magnet whose north-south orientations likewise are preferably in parallel or antiparallel to the second tilting axis and/or perpendicular with respect to the first tilting axis. The third and/or the fourth permanent magnet may be situated and designed in a mirror image with respect to the first and/or the second permanent magnet, in particular with respect to the first tilting axis, in particular when an electrical current flow direction in a section of the electrical conduction device situated closest to the first and second permanent magnets extends oppositely from an electrical current flow direction in a section of the electrical conduction device situated closest to the third and fourth permanent magnets.

According to another preferred refinement of the present invention, the permanent magnet device includes at least one first permanent magnet and/or at least one second permanent magnet. A magnetic north-south orientation of the first permanent magnet and/or a magnetic north-south orientation of the second permanent magnet are/is preferably perpendicular to the second tilting axis. A particularly favorable orientation of the magnetic flux lines in the area of the electrical conduction device may be achieved in this way as well. The permanent magnet device also preferably includes a third and/or a fourth permanent magnet whose north-south orientations likewise are preferably perpendicular to the second tilting axis. The third and/or the fourth permanent magnet may be situated and designed in a mirror image with respect to the first and/or the second permanent magnet, as described above.

According to another preferred refinement of the present invention, at least two permanent magnets, preferably two permanent magnets in each case, are situated in the axial direction, relative to the second tilting axis, at different distances from the electrical conduction device, in particular from a section of the electrical conduction device situated closest to each of the two permanent magnets. This may result in a further improvement of the configuration of the magnetic flux lines in the area of the electrical conduction device. The at least two permanent magnets may be in particular the first and second permanent magnets and/or the third and fourth permanent magnets described above.

According to another preferred refinement of the present invention, the actuator element of the tilting device is designed as a metallic surface, a section of the electrical strip conductor in which the Lorentz force is generated being implemented by the metallic surface. The metallic surface may thus be used multifunctionally in a particularly efficient manner, as the result of which resource requirements and complexity in the manufacture of the actuator device may be reduced.

According to one preferred refinement of the method according to the present invention, electrical current is conducted by the electrical conduction device in such a way that the actuator element of the tilting device is tilted about the first tilting axis in a resonant periodic movement, in particular to achieve fast tilting about a fast axis. The second magnetic field may be generated in such a way that the tilting device and/or the actuator element are/is quasistatically tilted about the second tilting axis in order to achieve slow tilting about the slow axis.

BRIEF DESCRIPTION THE DRAWINGS

The present invention is explained in greater detail below with reference to the exemplary embodiments illustrated in the schematic figures. Features of the micromechanical actuator devices according to the present invention are described below based on micromirrors as examples of micromechanical actuator devices. However, the specific embodiments described and shown, and all variants, are likewise applicable to any other arbitrary actuator devices.

FIGS. 4A through 4D show schematic full and detail views from various directions of a micromirror according to yet another specific embodiment of the present invention.

Figure 1A:
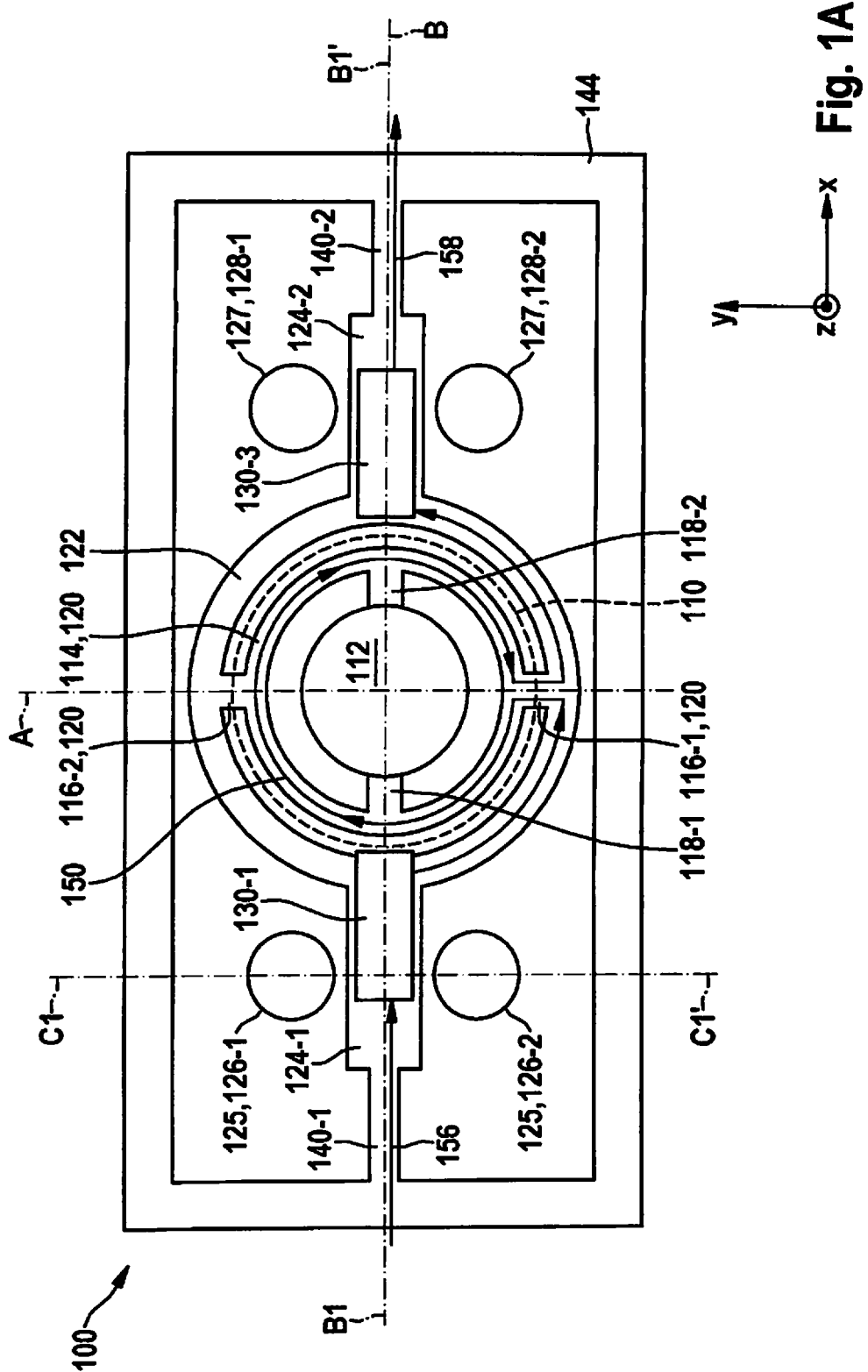
FIG. 1A through FIG. 1D show schematic full and detail views from various directions of a micromirror according to one specific embodiment of the present invention.

Unless stated otherwise, identical or functionally equivalent elements and devices are provided with the same reference numerals in all figures. The numbering of method steps is used for clarity, and in particular is not to be construed as a specific chronological sequence. In particular, multiple method steps may also be carried out concurrently. For the sake of understandability, elements of the figures are not rendered true to scale.

DETAILED DESCRIPTION OF EXAMPLE EMBODIMENTS

FIG. 1A shows a schematic top view onto a micromirror 100 according to one specific embodiment of the present invention. Micromirror 100 includes a tilting device 110 that includes a mirror element 112 and a flexible spring 114. Mirror element 112 of micromirror 100 is implemented, for example, as a metallic surface on a substrate, and in the top view is designed as a flat disk, for example. Mirror element 112 is connected to flexible spring 114 via two first webs 118-1, 118-2, in particular via only these webs, for example from the same substrate as the substrate beneath the metallic surface of mirror element 112.

Flexible spring 114 is designed, for example, as a circular ring in an x-y plane, as illustrated in FIG. 1A, and completely encloses mirror element 112 in the x-y plane, in which mirror element 112 is in the rest position. Flexible spring 114 is connected to a retaining device 122 via two second webs 116-1, 116-2, in particular via only second webs 116-1, 116-2. Retaining device 122 is likewise designed as a circular ring, and encloses mirror element 112 as well as flexible spring 114 in the x-y plane in a rest position of tilting device 110. At least second webs 116-1, 116-2, optionally also first webs 118-1, 118-2, are designed as torsion springs in micromirror 100, and together with flexible spring 114 form a first spring device 120.

Second webs 116-1, 116-2 are situated along a first tilting axis A of micromirror 100 on two opposite sides of flexible spring 114. First webs 118-1, 118-2 are situated along a second tilting axis B of micromirror 100 on opposite sides of mirror element 112. First tilting axis A is used in particular as a fast axis, and is perpendicular to second tilting axis B, which is used as a slow axis of micromirror 100. Except for first webs 118-1, 118-2, mirror element 112 is separate from the remainder of micromirror 100. Except for first webs 118-1, 118-2 and second webs 116-1, 116-2, flexible spring 114 is separate from the remainder of micromirror 100.

First to fourth permanent magnets 130-1, 130-2, 130-3, 130-4, referred to collectively as reference numeral 130-i, are provided on retaining device 122 and situated in such a way that a north-south orientation of each of permanent magnets 130-i is either in parallel or antiparallel to second tilting axis B. The totality of permanent magnets 130-i may be referred to as a permanent magnet device of micromirror 100. A first permanent magnet 130-1 and a second permanent magnet 130-2 are situated on one of two opposite sides of retaining device 122. A third permanent magnet 130-3 and a fourth permanent magnet 130-4 are situated on the second of the two opposite sides. First permanent magnet 130-1 is situated above second permanent magnet 130-2, and third permanent magnet 130-3 is situated above fourth permanent magnet 130-4, in a z direction which in an orthogonal coordinate system is perpendicular to the x direction and also to the y direction.

A first nonmagnetic and nonmagnetizable tongue 124-1 that is rigidly connected to retaining device 122 is situated between first and third permanent magnets 130-1, 130-3. A second nonmagnetic and nonmagnetizable tongue 124-2 that is rigidly connected to retaining device 122 is situated between second and fourth permanent magnets 130-2, 130-4. First tongue 124-1 is connected to frame device 144 via a torsion spring 140-1. Second tongue 124-2 is connected to frame device 144 via a torsion spring 140-2. Frame device 144 is designed, for example, as a rectangular frame which in the rest position encloses retaining device 122, flexible spring 114, and/or mirror element 112 in the x and y directions. Retaining device 122 is coupled to frame device 144 solely via tongues 124-1, 124-2 and torsion springs 140-1, 140-2. Tongues 124-1, 124-2 may in particular be manufactured concurrently with retaining device 122, and from the same material.

An electrical conduction device 150 for conducting electrical current in an almost completely closed circle around mirror element 112 is guided on flexible spring 114 of tilting device 110. A first strip conductor 156 and a second strip conductor 158, which connect electrical conduction device 150 to a first and a second electrical pole, respectively, are guided via the same web 116-1, first and second strip conductors 156, 158 being guided via retaining device 122 up to first web 116-1. Electrical conduction device 150 and/or first and second strip conductors 156, 158 may in each case be implemented by a metallic layer and/or by a doped area in a substrate of flexible spring 114, of retaining device 122, of tongues 124-1, 124-2, of torsion springs 140-1, 140-2, and/or of frame device 144.

Figure 1B:
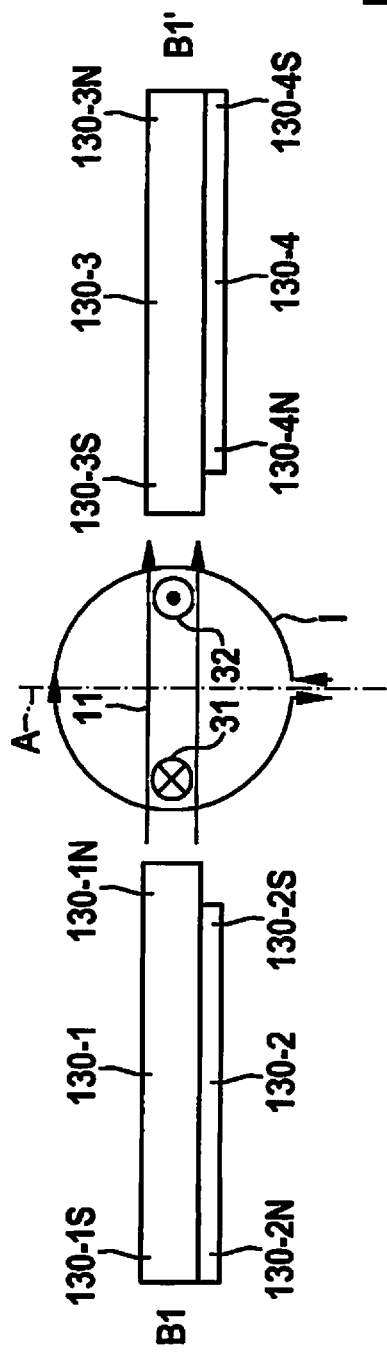

FIG. 1B shows a schematic detailed view in the top view onto permanent magnets 130-i together with resulting forces when a current I is conducted through electrical conduction device 150 in the clockwise direction. For reasons of recognizability with respect to first and third permanent magnets 130-1, 130-3, second and fourth permanent magnets 130-2, 130-4 are illustrated in an offset manner in FIG. 1B in the y direction, which, however, is preferably not the case. A magnetic north pole 130-1N of first permanent magnet 130-1 is situated facing conduction device 150, and closer to conduction device 150 than is a magnetic south pole 130-2S of second permanent magnet 130-2, which likewise faces conduction device 150. On the other side of electrical conduction device 150, a magnetic south pole 130-3S of third permanent magnet 130-3 is situated facing conduction device 150 and closer to conduction device 150 than is a magnetic north pole 130-4N of fourth permanent magnet 130-4, which likewise faces conduction device 150.

A magnetic south pole 130-1S of first permanent magnet 130-1 and a magnetic north pole 130-2N of second permanent magnet 130-2 may end in flush alignment with one another in the axial direction along second tilting axis B, i.e., in the x direction. A magnetic north pole 130-3N of third permanent magnet 130-3 and a magnetic south pole 130-4S of fourth permanent magnet 130-4 may end in flush alignment with one another in the axial direction along second tilting axis B.

FIG. 1B also illustrates that a first Lorentz force 31 and a second Lorentz force 32 are generated by interaction of an electrical current I that is applied to conduction device 150, and magnetic flux lines 11 of first through fourth permanent magnets 130-i. First Lorentz force 31 is generated in a section of conduction device 150 situated closest to first permanent magnet 130-1, acts on conduction device 150 together with flexible spring 114 on which the conduction device is situated, and is directed in the negative z direction. Second Lorentz force 32 is generated in a section of conduction device 150 situated closest to third permanent magnet 130-3, acts on conduction device 150 and flexible spring 114, and is directed in the positive z direction. In combination, first and second Lorentz forces 31, 32 effectuate tilting of mirror element 112, depending on the design, accompanied by a deformation of first spring device 120, i.e., flexible spring 114 and/or second webs 116-1, 116-2, as torsion springs. Mirror element 112 is thus acted on with an angular momentum in the negative y direction. When electrical current I is applied with an opposite current flow direction, and for example the polarities of the first and the second poles are reversed, mirror element 112 is correspondingly acted on with an angular momentum in the positive y direction.

Figure 1C:
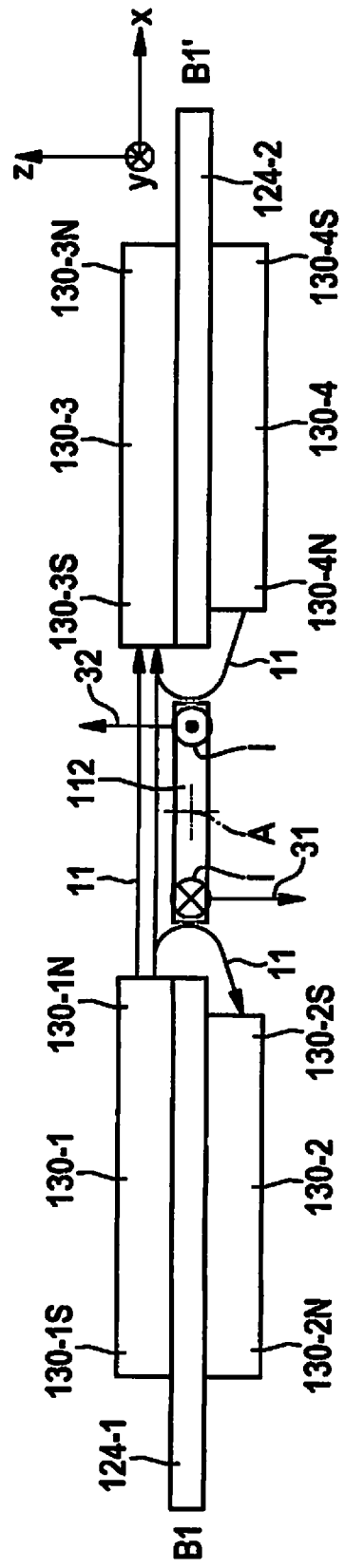

FIG. 1C shows a schematic side view of the elements and forces illustrated in FIG. 1B. It is apparent in FIG. 1C that the offset arrangement of permanent magnets 130-*i* is used to generate particularly large components of first magnetic field 11 in the positive and negative x directions in the area of current I through conduction device 150.

Figure 1D:
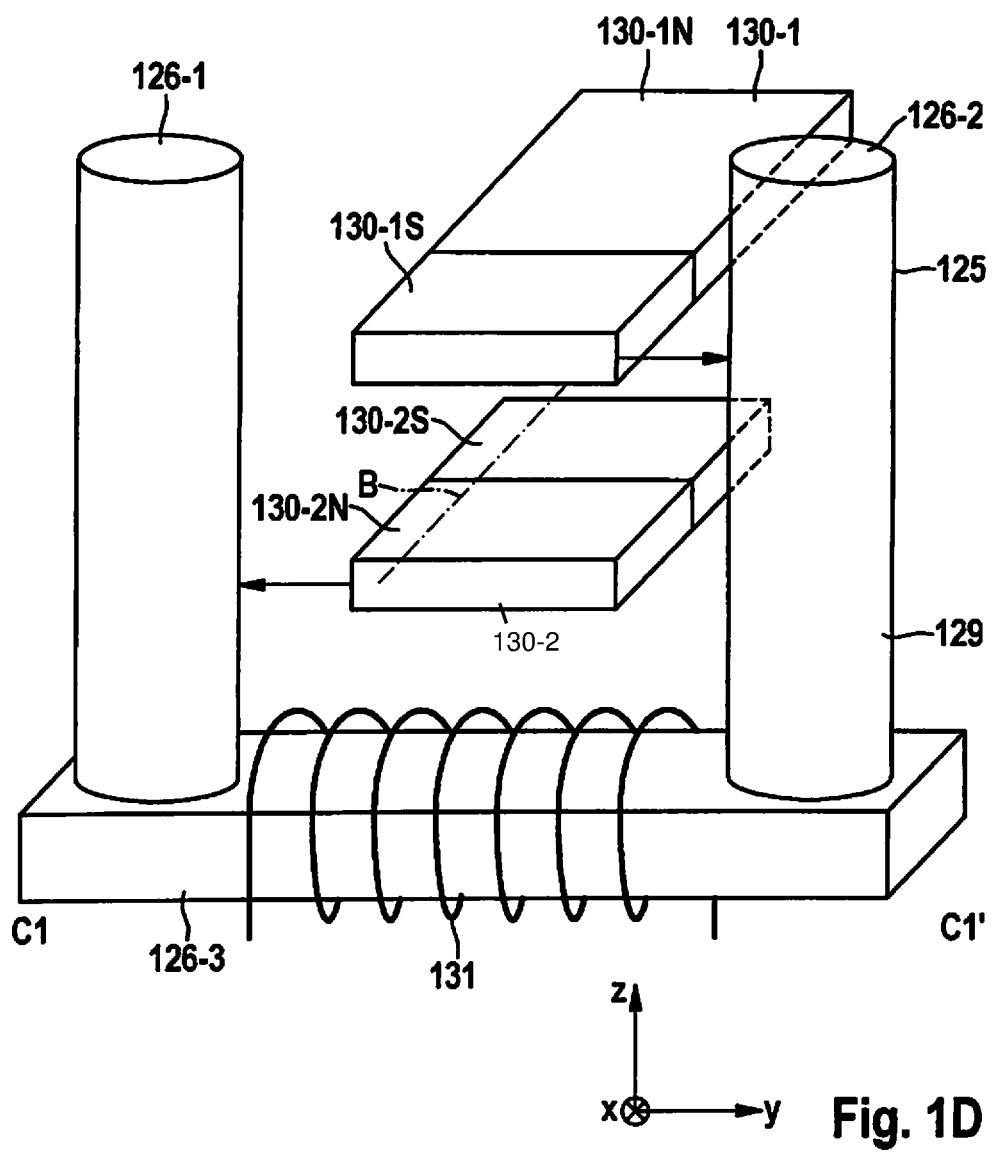

In addition, FIG. 1A illustrates a first electromagnet 125 and a second electromagnet 127 of micromirror 100. As is apparent in FIG. 1D, first electromagnet 125 includes a U-shaped magnetic flux-guiding plate 129. Flux-guiding plate 129 is made up of a transverse bar 126-3, which is connected at each end to an arm 126-1, 126-2. Transverse bar 126-3 is wrapped with an energizable coil 131, so that, by energizing coil 131, arms 126-1, 126-2 function as a magnetic north pole and south pole, or conversely. As also illustrated in FIG. 1D, first and second permanent magnets 130-1, 130-2 are situated in such a way that magnetic south pole 130-1S of first permanent magnet 130-1 and magnetic north pole 130-2N of second permanent magnet 130-2 are situated between arms 126-1, 126-2 in the y direction, and are situated dead even with arms 126-1, 126-2 in the x and z directions.

A second magnetic field through electromagnet 125 is thus generatable by energizing coil 131. Permanent magnets 130-1, 130-3, which are rotatably situated with respect to frame device 144 with the aid of torsion spring 140-1, are favorably energetically oriented in the second magnetic field. As a result, retaining device 122, which is rigidly connected to permanent magnets 130-1, 130-3 via tongues 124-1, 124-2, tilts on torsion spring 140-1 along second tilting axis B. Second electromagnet 127 is situated and designed mirror-symmetrically with respect to first electromagnet 125 relative to first tilting axis A. When coil 131 is energized, a coil of second electromagnet 127 with arms 128-1, 128-2 at the same time is energized in such a way that retaining device 122 is also tilted on torsion spring 140-2 along second tilting axis B, tilting taking place in each case on torsion springs 140-1, 140-2 with the same rotational direction, i.e., with an angular momentum either in the positive or negative x direction.

Electromagnets 125, 127 may be mounted on frame device 144. For example, electromagnets 125, 127 as well as frame device 144 may be connected to a circuit board, with the aid of which electrical current I is feedable into conduction device 150, and/or with the aid of which the electrical coils of electromagnets 125, 127 are energizable.

FIGS. 2A through 2D show a micromirror 200 according to another specific embodiment of the present invention. Micromirror 200 is a variant of micromirror 100, and differs from same in the guiding of an electrical conduction device 250 via tilting device 110 and retaining device 122 of micromirror 200 instead of conduction device 150 of micromirror 100, and also in a resulting different configuration of first through fourth permanent magnets 230-*i* of micromirror 200 instead of permanent magnets 130-*i* of micromirror 100.

Figure 2A:
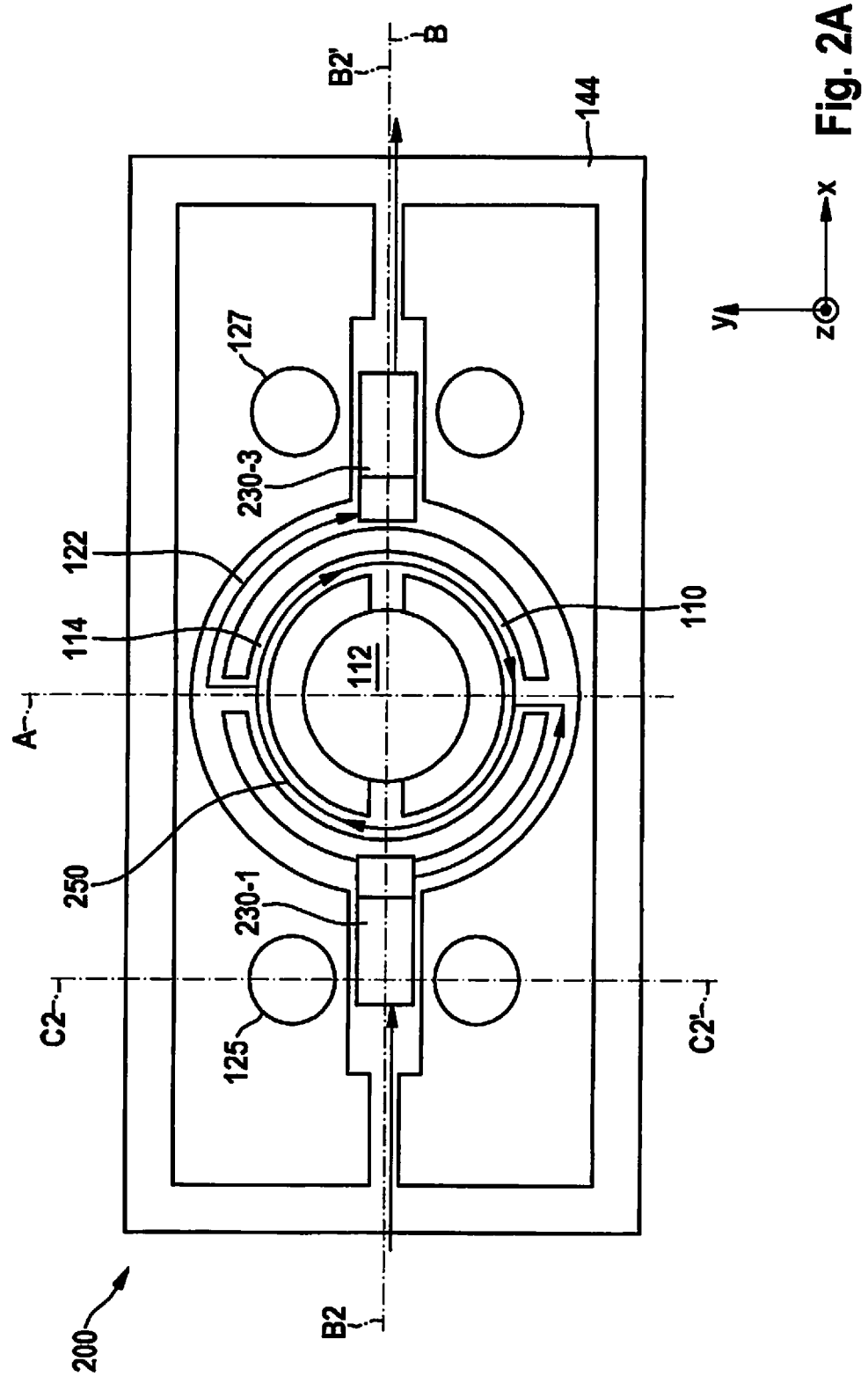
FIGS. 2A through 2D show schematic full and detail views from various directions of a micromirror according to another specific embodiment of the present invention.
Figure 2B:
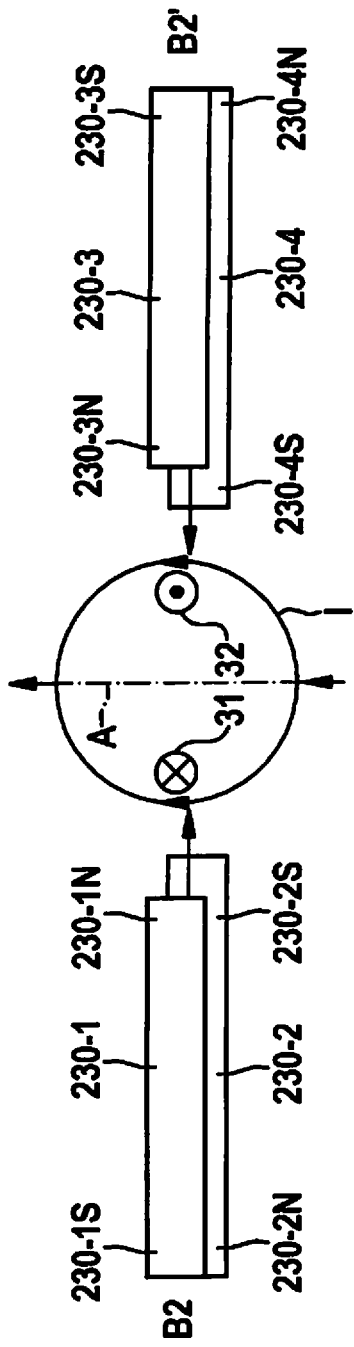
Figure 2C:
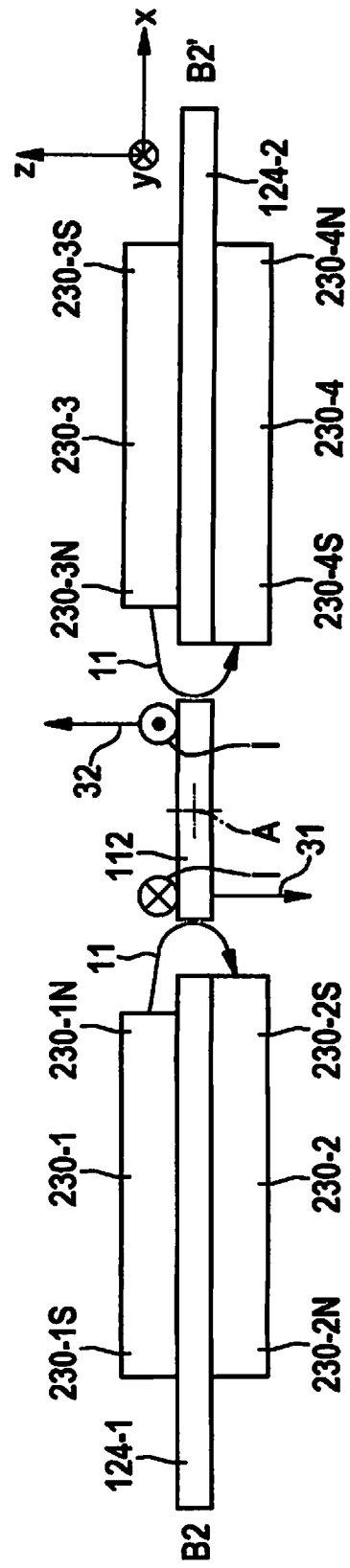
Figure 2D:
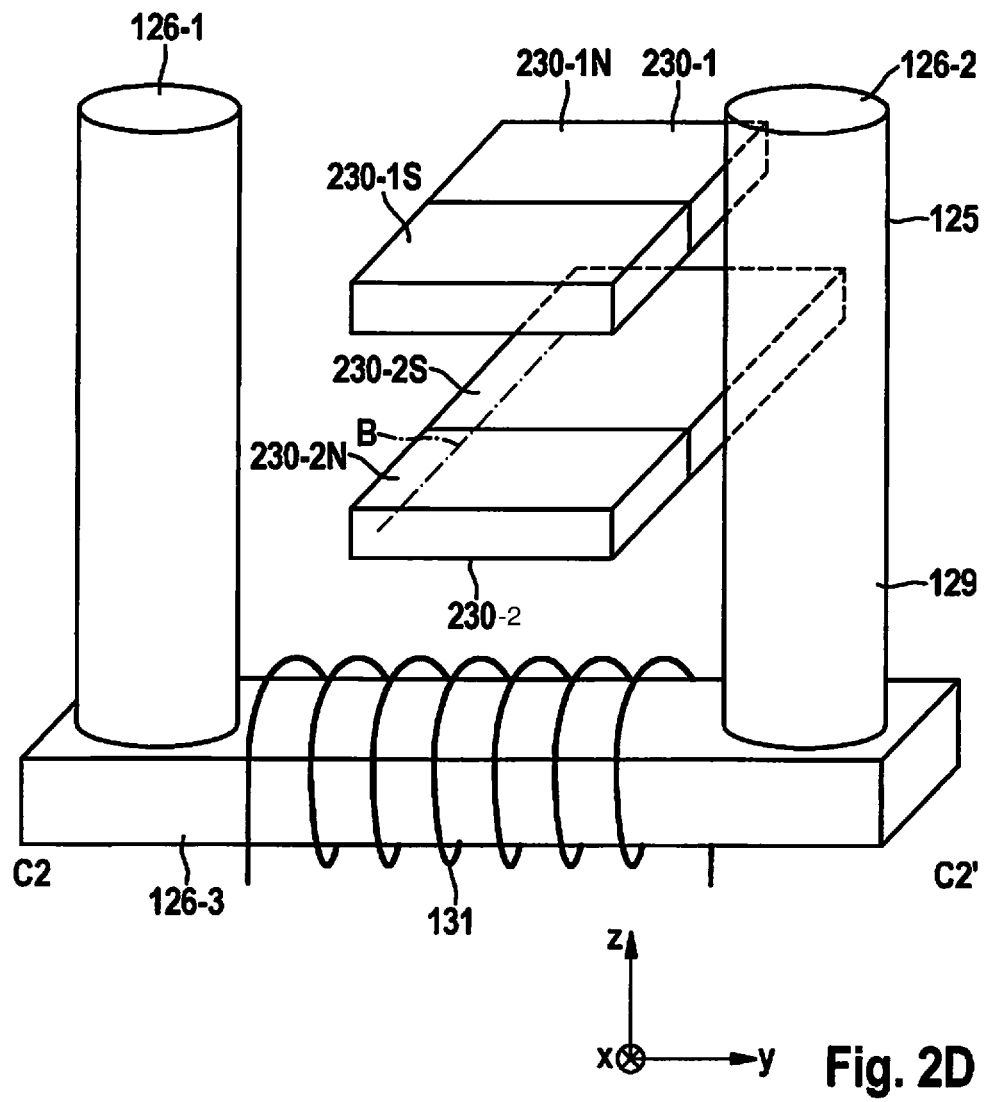

FIG. 2A schematically shows micromirror 200 in a top view. FIG. 2B shows a schematic detailed view in the top view onto permanent magnets 230-*i* and mirror element 112 together with resulting forces when a current I is conducted through electrical conduction device 250 in the positive y direction. FIG. 2C shows a schematic side view of the elements and forces illustrated in FIG. 2B. FIG. 2D schematically shows an arrangement of first and second permanent magnets 230-1, 230-2 between first electromagnet 125.

Conduction device 250 is guided on flexible spring 114 mirror-symmetrically with respect to first tilting axis A, as the result of which electrical current I is conductable mirror-symmetrically with respect to first tilting axis A. Conduction device 250 is connected to the first electrical pole via a first of two second webs 116-1 designed as a torsion spring, and is connected to the second electrical pole via a second of two second webs 116-2 designed as a torsion spring.

First and third permanent magnets 230-1, 230-3, which, the same as first and third permanent magnets 130-1, 130-3, are situated above retaining device 122 in the positive z direction, and are situated in each case with their north poles 230-1N, 230-3N in the direction of mirror element 112. Second and fourth permanent magnets 230-2, 230-4, which are situated below retaining device 122 in the negative z direction, are situated in each case with their south poles 230-2S, 230-4S in the direction of mirror element 112. South pole 230-2S of second permanent magnet 230-2 is situated closer to conduction device 250 in the x direction than is north pole 230-1N of first permanent magnet 230-1. South pole 230-4S of fourth permanent magnet 230-4 is situated closer to conduction device 250 in the x direction than is north pole 230-3N of third permanent magnet 230-3.

Magnetic poles 230-1S, 230-2N facing away from mirror element 112 may be situated in flush alignment in the x direction. Magnetic poles 230-3S, 230-4N facing away from mirror element 112 may be situated in flush alignment in the x direction. In particular the arrangement and design of first and second permanent magnets 230-1, 230-2 with respect to first tilting axis A are mirror-symmetrical with respect to the arrangement and design of third and fourth permanent magnets 230-3, 230-4. According to FIG. 2D, first and second permanent magnets 230-1, 230-2 are situated the same way as first and second permanent magnets 130-1, 130-2 with regard to arms 126-1, 126-2 of first electromagnet 125.

FIGS. 3A through 3D show a micromirror 300 according to another specific embodiment of the present invention.

Micromirror 300 is a variant of micromirror 200, and differs from same in a tilting device 310 of micromirror 300 instead of tilting device 110 of micromirror 100, and in the guiding of an electrical conduction device 350 instead of conduction device 250 of micromirror 200.

Figure 3A:
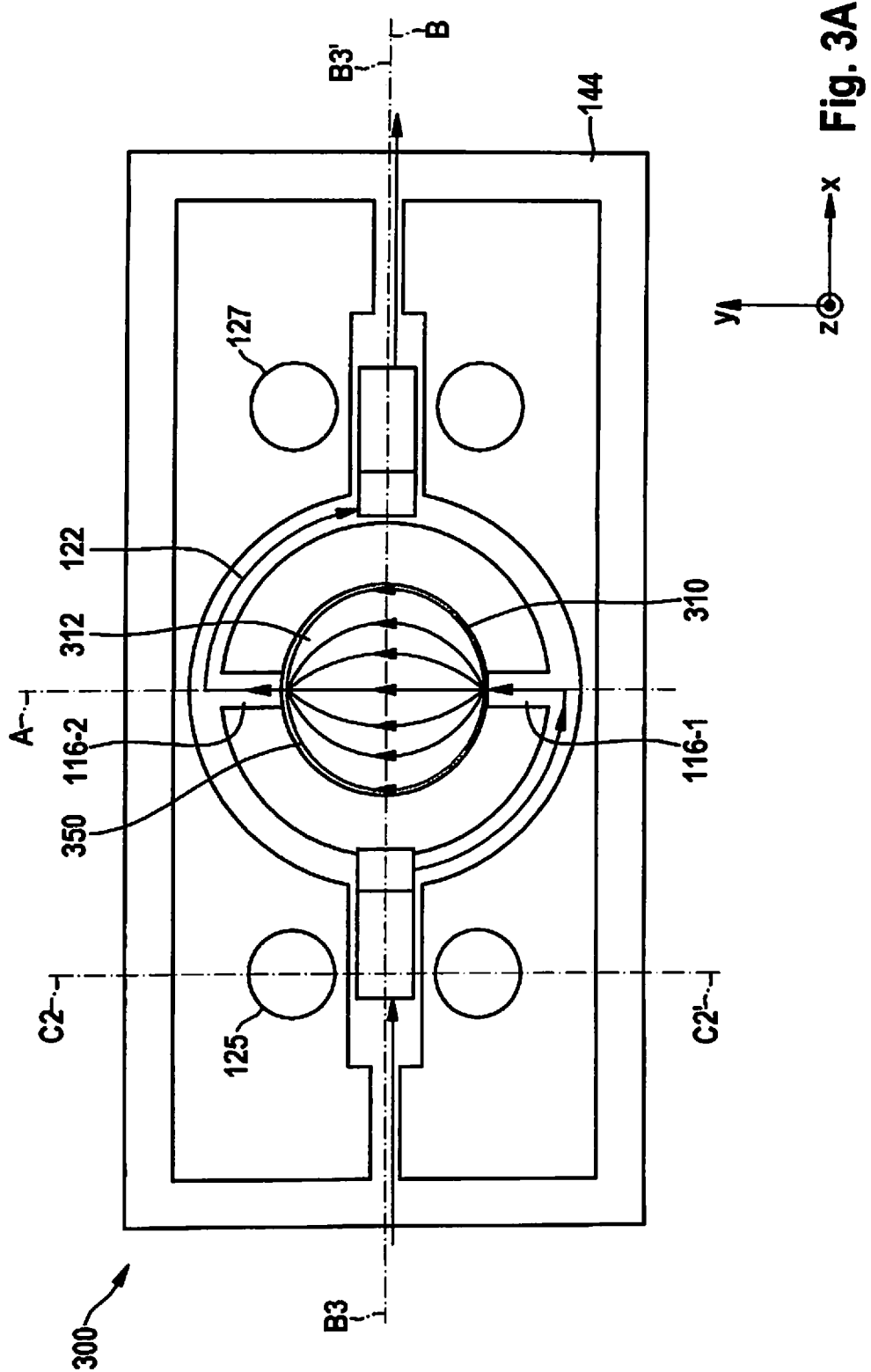
FIGS. 3A through 3C show schematic full and detail views from various directions of a micromirror according to yet another specific embodiment of the present invention.
Figure 3B:
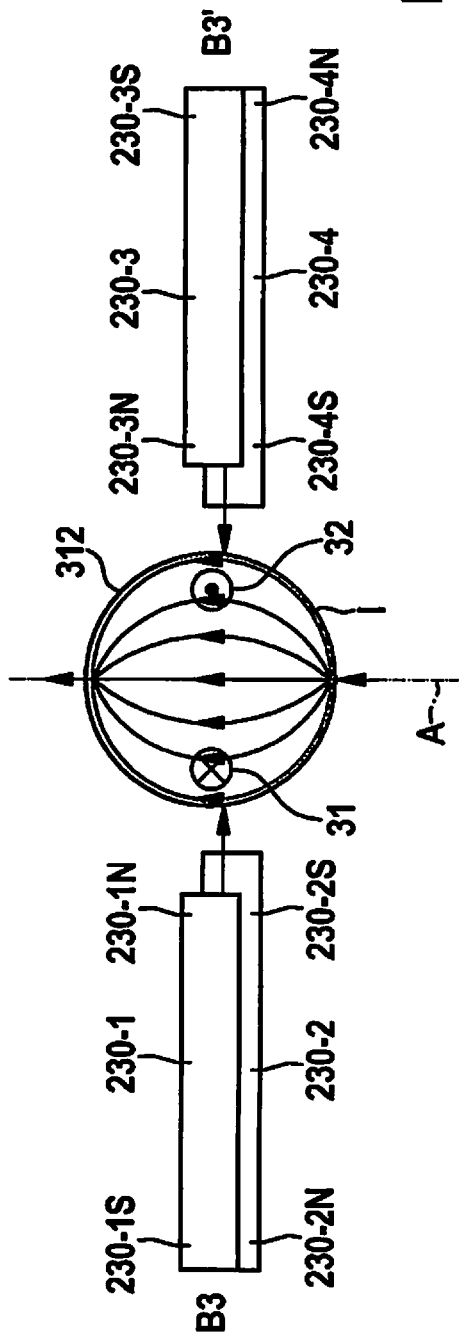
Figure 3C:
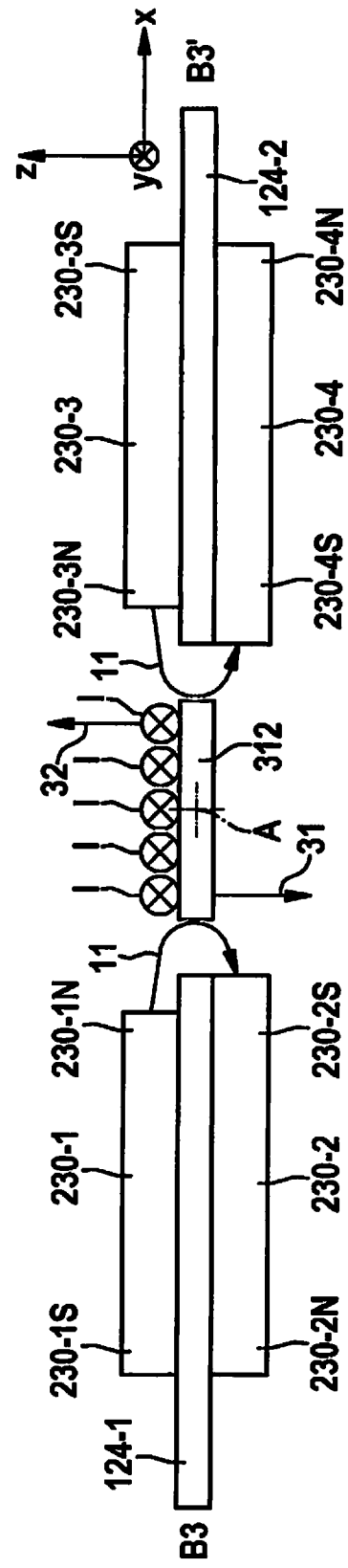

FIG. 3A schematically shows micromirror 300 in a top view. FIG. 3B shows a schematic detailed view in the top view onto permanent magnets 230-*i* and mirror element 312 together with resulting forces when a current I is conducted through conduction device 350 in the positive y direction. FIG. 3C shows a schematic side view of the elements and forces illustrated in FIG. 3B. First and second permanent magnets 230-1, 230-2 between first electromagnet 125 are arranged as illustrated in FIG. 2D.

In micromirror 300, tilting device 310 is made up of mirror element 312, which is connected to retaining device 122 via second webs 116-1, 116-2 that function as torsion springs. Instead of a symmetrical guiding via flexible spring 114, as is the case for micromirror 200, in micromirror 300 a metallic surface that functions as mirror element 312 of micromirror 300 is directly contacted, and is used as part of electrical conduction device 350. Applied electrical current I thus flows from the direction of web 116-1 in the direction of web 116-2, or conversely, across the entire metallic surface, or a spaced-apart portion of the metallic surface, of mirror element 312. Since for micromirror 300 as well, electrical current I is conducted mirror-symmetrically with respect to first tilting axis A according to conduction device 350, permanent magnets 230-*i* of micromirror 300 are designed and situated the same way as permanent magnets 230-*i* of micromirror 200.

FIGS. 4A through 4D show a micromirror 400 according to yet another specific embodiment of the present invention. Micromirror 400 is a variant of micromirror 100, and differs from same in the design and arrangement of permanent magnets 430-*i* of micromirror 400.

Figure 4A:
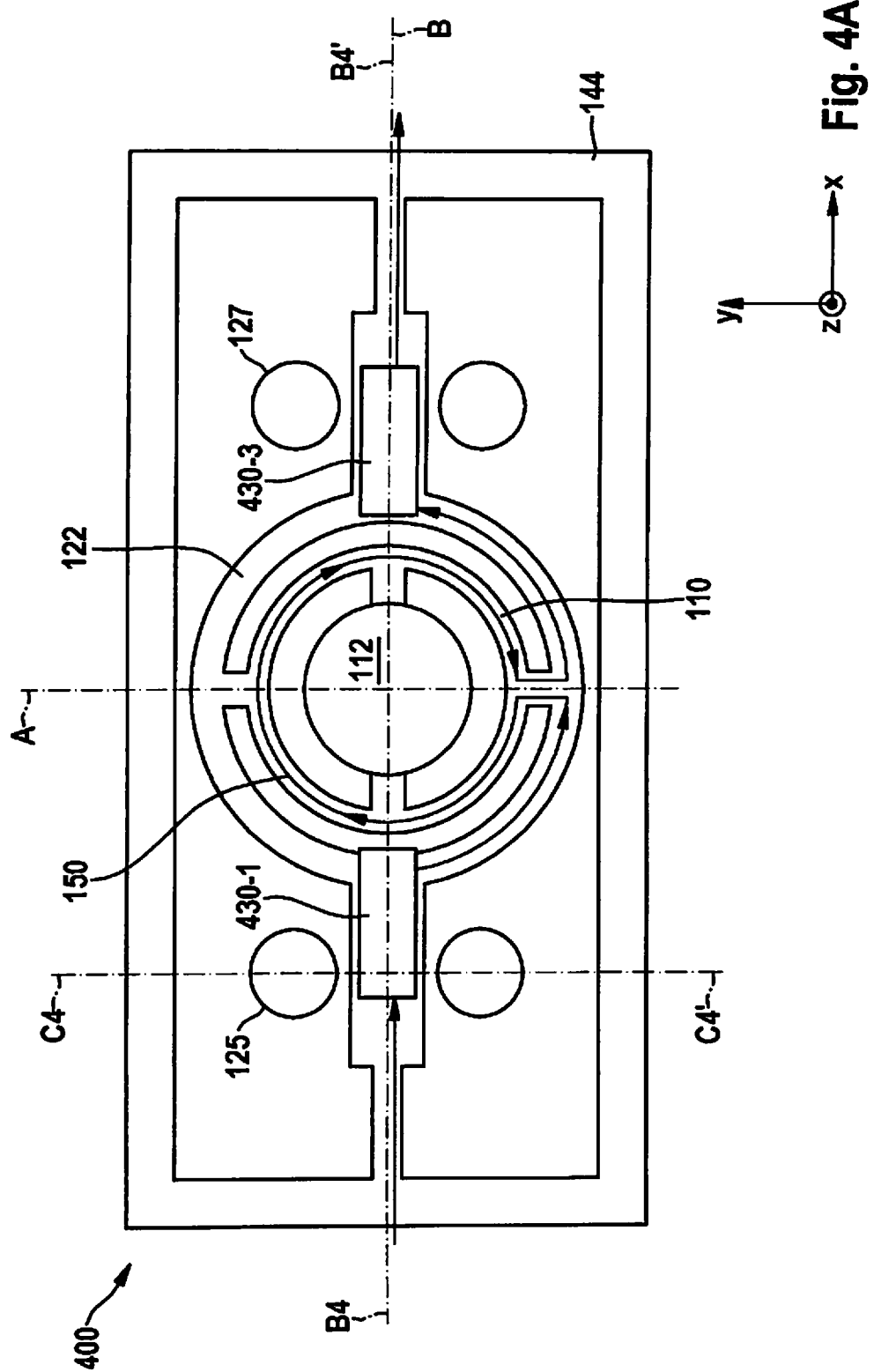
Figure 4D:
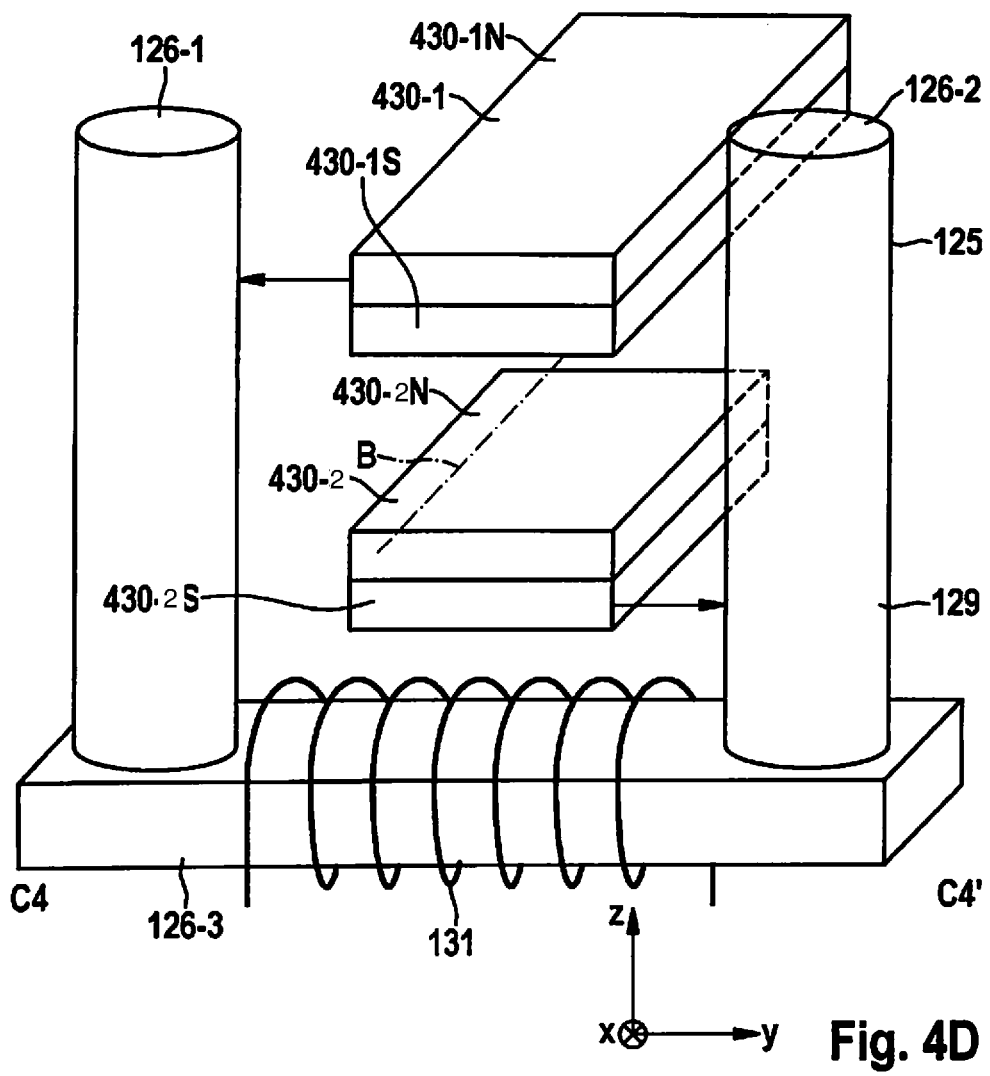

FIG. 4A schematically shows micromirror 400 in a top view. FIG. 4B shows a schematic detailed view in the top view onto permanent magnets 430-*i* and mirror element 112 together with resulting forces when a current is conducted through electrical conduction device 150 in the clockwise direction. FIG. 4C shows a schematic side view of the elements and forces illustrated in FIG. 4B. FIG. 4D schematically shows an arrangement of first and second permanent magnets 430-1, 430-2 between first electromagnet 125.

In micromirror 400, the magnetic north-south axes of permanent magnets 430-*i*, in a rest position without an applied electrical current I and without energization of coils, are perpendicular to first tilting axis A and also to second tilting axis B. First permanent magnet 430-1 is situated closer to mirror element 112 in the x direction than is second permanent magnet 430-2, and third permanent magnet 430-3 is situated closer to mirror element 112 in the x direction than is fourth permanent magnet 430-4, it being possible for ends of permanent magnets 430-*i* facing away from mirror element 112 to be in flush alignment in pairs in each case in the x direction.

North pole 430-1N of first permanent magnet 430-1 faces away from second permanent magnet 430-2, while south pole 430-1S of first permanent magnet 430-1 faces second permanent magnet 430-2. North pole 430-2N of second permanent magnet 430-2 faces first permanent magnet 430-1, while south pole 430-2S of second permanent magnet 430-2 faces away from first permanent magnet 430-1. First and second permanent magnets 430-1, 430-2 are situated on outer sides of tongue 124-1 facing away from one another, the same as first and second permanent magnets 130-1, 130-2, 230-1, 230-2.

North pole 430-3N of third permanent magnet 430-3 faces fourth permanent magnet 430-4, while south pole 430-3S of third permanent magnet 430-3 faces away from fourth permanent magnet 430-4. North pole 430-4N of fourth permanent magnet 430-4 faces away from third permanent magnet 430-3, while south pole 430-4S of fourth permanent magnet 430-4 faces third permanent magnet 430-3. Third and fourth permanent magnets 430-3, 430-4 are situated on outer sides of tongue 124-2 facing away from one another, the same as third and fourth permanent magnets 130-3, 130-4, 230-3, 230-4.

Accordingly, as shown in FIG. 4D, in each case north poles and south poles 430-1N, 430-1S, 430-2N, 430-2S of first and second permanent magnets 430-1, 430-2 are situated between arms 126-1, 126-2 of flux-guiding plate 129 of first electromagnet 125, in particular preferably at an end of permanent magnets 430-*i* facing away from mirror element 112. The same applies for second electromagnet 127 and third and fourth permanent magnets 430-3, 430-4.

Figure 5:
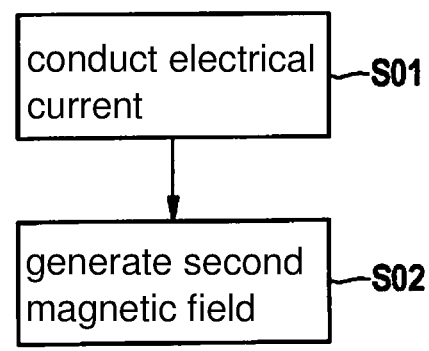
FIG. 5 shows a schematic flow chart for explaining a method for tilting a micromirror according to one specific embodiment of the present invention.

FIG. 5 shows a schematic flow chart for explaining a method according to one specific embodiment of the present invention. The method according to FIG. 5 may be carried out with the micromirror according to the present invention, in particular with one of micromirrors 100; 200; 300; 400, and is adaptable with regard to all described refinements and modifications of the micromirrors according to the present invention, and conversely.

In a step S01, an electrical current I, in particular alternating current, is conducted by an electrical conduction device 150; 250; 350, which is guided via a tilting device 112; 312 of the micromirror, within a first magnetic field 11 generated by a permanent magnet device 130-*i*; 230-*i*; 430-*i* of micromirror 100; 200; 300; 400, so that a mirror element 112; 312 of tilting device 110; 310 is tilted along a first tilting axis A as the result of a Lorentz force 31, 32.

In a step S02, a second magnetic field is generated by an electromagnet device 125, 127 of micromirror 100; 200; 300; 400 in the area of permanent magnet device 130-*i*; 230-*i*; 430-*i*, so that tilting device 110; 310 is tilted along a second tilting axis B, which in particular is perpendicular to first tilting axis A, as the result of magnetic attraction and repulsion.

The electrical current is preferably conducted through electrical conduction device 150; 250; 350 in such a way that mirror element 112; 312 of tilting device 110; 310 is tilted along first tilting axis A in a resonant periodic movement. The second magnetic field is preferably generated in such a way that tilting device 110; 310 is quasistatically tilted along second tilting axis B.

Although the present invention has been described above with reference to preferred exemplary embodiments, it is not limited thereto, and instead is modifiable in numerous ways. In particular, the present invention may be changed or modified in various ways without departing from the core of the present invention. For example, the north-south orientation of all permanent magnets of a micromirror 100; 200; 300; 400 may also extend exactly opposite one another, as illustrated in each case for micromirrors 100; 200; 300; 400.

For example, flexible spring 114 may also be designed as a uniformly shaped but rigid element, so that first spring device 120 is made up only of second webs 116-1, 116-2. Instead of exactly two first webs 118-1, 118-2, it is also possible, for example, to provide only one web, or three or more webs. Instead of circular (ring) shapes for flexible spring 114, for retaining device 122, and/or for mirror element 112; 312, other shapes such as rectangular shapes may also be used.

Conduction devices 150; 250; 350 are illustrated in the figures as single-layer conductor structures for the sake of clarity. However, conduction devices 150; 250; 350 may also have a two- or multilayered design, for example in a helical shape; in particular, two or more strip conductors may be situated in permanent magnets 130-*i*; 230-*i*; 430-*i* one above the other in the z direction, on the sections of conduction devices 150; 250; 350 situated closest, so that generated Lorentz forces 31, 32 are correspondingly greater.

What is claimed is:

1. A micromechanical actuator device, comprising:
   a tilting device that includes an actuator element;
   a first spring device;
   a retaining device, the tilting device being connected to the retaining device via the first spring device so as to be tiltable about a first tilting axis;
   at least one electrical conduction device that is guided via the tilting device by extending along a path that is one of in and on the tilting device;
   a permanent magnet device that is directly attached to a surface of the retaining device, the permanent magnet device being designed for generating a first magnetic field in such a way that when an electrical current is conducted through the electrical conduction device, a Lorentz force is generatable within the first magnetic field, via which the tilting device is tiltable about the first tilting axis with respect to the retaining device;
   a frame device;
   a second spring device via which the retaining device is connected to the frame device so as to be tiltable about a second tilting axis; and
   an electromagnet device that is designed for generating a second magnetic field which acts on the permanent magnet device in such a way that the retaining device is tiltable about the second tilting axis with respect to the frame device.

2. The device as recited in claim 1, wherein the first spring device includes a first torsion spring; and wherein a first electrical strip conductor for connecting the electrical conduction device to a first electrical pole is guided via the first torsion spring.

3. The device as recited in claim 2, wherein the first spring device also includes a second torsion spring, a second electrical strip conductor for connecting the electrical conduction device to a second electrical pole being guided via at least one of the first torsion spring and the second torsion spring.

4. The device as recited in claim 3, wherein the second spring device includes at least one third torsion spring via which at least one electrical strip conductor is guided for connecting the electrical conduction device to at least one electrical pole.

5. The device as recited in claim 4, wherein the permanent magnet device includes at least one of: (i) at least one first permanent magnet, and (ii) at least one second permanent magnet, and wherein at least one of: (i) a magnetic north-south orientation of the at least one first permanent magnet being situated in parallel to the second tilting axis; and (ii) a magnetic north-south orientation of the at least one second permanent magnet being situated antiparallel to the second tilting axis.

6. The device as recited in claim 5, wherein at least two permanent magnets are situated in the axial direction, relative to the second tilting axis, at different distances from the electrical conduction device.

7. The device as recited in claim 4, wherein the permanent magnet device includes at least one of: (i) at least one first permanent magnet, and (ii) at least one second permanent magnet, and wherein at least one of: (i) a magnetic north-south orientation of the at least one first permanent magnet, and (ii) a magnetic north-south orientation of the at least one second permanent magnet, being situated perpendicular to the second tilting axis.

8. The device as recited in claim 1, wherein the actuator element of the tilting device is designed as a metallic surface, and a section of the electrical strip conductor in which the Lorentz force is generated being implemented by the metallic surface.

9. A method for tilting a micromechanical actuator device, comprising:
conducting electrical current through an electrical conduction device that is guided via a tilting device of the actuator device by extending along a path that is one of in and on the tilting device, within a first magnetic field that is generated by a permanent magnet device of the actuator device that is directly attached to a surface of a retaining device, the tilting device being connected to the retaining device so as to be tiltable about a first tilting axis, so that at least one of the tilting device, and an actuator element of the tilting device, is tilted along the first tilting axis as the result of a Lorentz force; and
generating a second magnetic field by an electromagnet device of the actuator device in the area of the permanent magnet device, so that at least one of the tilting device, and the actuator element is tilted along a second tilting axis as the result of magnetic attraction and repulsion.

10. The method as recited in claim 9, wherein the electrical current is conducted through the electrical conduction device in such a way that the actuator element of the tilting device is tilted about the first tilting axis in a resonant periodic movement; and the second magnetic field is generated in such a way that at least one of the tilting device, and the actuator element, is quasistatically tilted along the second tilting axis.

* * * * *